(12) United States Patent
Gaillard et al.

(10) Patent No.: US 6,897,163 B2
(45) Date of Patent: May 24, 2005

(54) METHOD FOR DEPOSITING A LOW DIELECTRIC CONSTANT FILM

(75) Inventors: Frederic Gaillard, Voiron (FR);
Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/355,379

(22) Filed: Jan. 31, 2003

(65) Prior Publication Data

US 2004/0152338 A1 Aug. 5, 2004

(51) Int. Cl.⁷ .............................................. H01L 21/31
(52) U.S. Cl. ...................... 438/778; 438/780; 438/787; 438/788; 438/790
(58) Field of Search ................................ 438/623, 627, 438/676, 687, 778, 780, 787, 788, 790, 789

(56) References Cited

U.S. PATENT DOCUMENTS

| | | | |
|---|---|---|---|
| 4,532,150 A | 7/1985 | Endo et al. ................. 427/39 |
| 4,845,054 A | 7/1989 | Mitchener | |
| 4,981,724 A | 1/1991 | Hochberg et al. | |
| 5,000,113 A | 3/1991 | Wang et al. ................. 118/723 |
| 5,003,178 A | 3/1991 | Livesay | |
| 5,554,570 A | 9/1996 | Maeda et al. | |
| 5,593,741 A | 1/1997 | Ikeda | |
| 5,598,027 A | 1/1997 | Matsuura | |
| 5,599,740 A | 2/1997 | Jang et al. | |
| 5,616,369 A | 4/1997 | Williams et al. | |
| 5,618,619 A | 4/1997 | Petrmichl et al. | |
| 5,637,351 A | 6/1997 | O'Neal et al. | |
| 5,638,251 A | 6/1997 | Goel et al. ................. 361/313 |
| 5,679,413 A | 10/1997 | Petrmichl et al. | |
| 5,683,940 A | 11/1997 | Yahiro | |
| 5,693,563 A | 12/1997 | Teong | |
| 5,700,720 A | 12/1997 | Hashimoto | |
| 5,703,404 A | 12/1997 | Matsuura | |

(Continued)

FOREIGN PATENT DOCUMENTS

| | | |
|---|---|---|
| DE | 196 54 737 A1 | 7/1997 |
| DE | 198 04 375 A1 | 7/1999 |
| DE | 199 04 311 A1 | 8/1999 |

(Continued)

OTHER PUBLICATIONS

A. Nara, et al., "Low Dielectric Constant Insulator Formed by Downstream Plasma CVD at Room Temperature Using TMS/O2", Japanese Journal of Applied Physics, vol. 36. No. 3B (Mar. 1997) pp. 1477–1480.

A. Grill, et al. "Low Dielectric Constant Films Prepared by Plasma–Enhanced Chemical Vapor Deposition From Tetramethylsilane", Journal of Applied Physics, vol. 85. No. 6 (Mar. 1999) pp. 3314–3318.

V. Hazari, et al., "Characterization Of Alternative Chemistries For Depositing PECVD Silicon Dioxide Films," DUMIC Conference,—333D/98/0319, Feb. 1998, pp. 319–326.

(Continued)

Primary Examiner—David Nelms
Assistant Examiner—Renee R. Berry
(74) Attorney, Agent, or Firm—Moser, Patterson & Sheridan

(57) ABSTRACT

A method for depositing a low dielectric constant film is provided. The low dielectric constant film includes at least one silicon oxycarbide layer and at least one substantially silicon-free layer comprising carbon and hydrogen. The layers are deposited from a gas mixture including an organosilicon compound and a silicon-free hydrocarbon-based compound. The low dielectric constant film is deposited by a plasma process than includes pulses of RF power.

18 Claims, 2 Drawing Sheets

U.S. PATENT DOCUMENTS

| Patent | Date | Inventor | Ref |
|---|---|---|---|
| 5,733,611 A | 3/1998 | Thurston et al. | 427/591 |
| 5,739,579 A | 4/1998 | Chiang et al. | |
| 5,753,564 A | 5/1998 | Fukada | |
| 5,776,990 A | 7/1998 | Hedrick et al. | |
| 5,789,319 A | 8/1998 | Havemann et al. | |
| 5,800,877 A | 9/1998 | Maeda et al. | |
| 5,807,785 A | 9/1998 | Ravi | |
| 5,821,168 A | 10/1998 | Jain | |
| 5,834,162 A | 11/1998 | Malba | |
| 5,858,880 A | 1/1999 | Dobson et al. | |
| 5,874,367 A | 2/1999 | Dobson | |
| 5,888,593 A | 3/1999 | Petrmichl et al. | |
| 5,891,799 A | 4/1999 | Tsui | |
| 5,989,998 A | 11/1999 | Sugahara et al. | 438/623 |
| 6,037,274 A | 3/2000 | Kudo et al. | |
| 6,051,321 A | 4/2000 | Lee et al. | 428/447 |
| 6,054,379 A | 4/2000 | Yau et al. | |
| 6,068,884 A | 5/2000 | Rose et al. | |
| 6,072,227 A | 6/2000 | Yau et al. | |
| 6,080,526 A | 6/2000 | Yang et al. | |
| 6,124,641 A | 9/2000 | Matsuura | |
| 6,140,226 A | 10/2000 | Grill et al. | |
| 6,147,009 A | 11/2000 | Grill et al. | |
| 6,159,871 A | 12/2000 | Loboda et al. | |
| 6,287,990 B1 | 9/2001 | Cheung et al. | 438/780 |
| 6,303,047 B1 | 10/2001 | Aronowitz et al. | |
| 6,303,523 B2 | 10/2001 | Cheung et al. | |
| 6,312,793 B1 | 11/2001 | Grill et al. | 428/312.6 |
| 6,316,063 B1 | 11/2001 | Andideh et al. | |
| 6,352,945 B1 | 3/2002 | Matsuki et al. | |
| 6,383,955 B1 | 5/2002 | Matsuki et al. | |
| 6,410,463 B1 | 6/2002 | Matsuki | |
| 6,413,583 B1 | 7/2002 | Moghadam et al. | |
| 6,432,846 B1 | 8/2002 | Matsuki | |
| 6,437,443 B1 | 8/2002 | Grill et al. | 257/758 |
| 6,441,491 B1 | 8/2002 | Grill et al. | 257/759 |
| 6,444,136 B1 | 9/2002 | Liu et al. | |
| 6,455,445 B2 | 9/2002 | Matsuki | |
| 6,479,110 B2 | 11/2002 | Grill et al. | 427/577 |
| 6,479,409 B2 | 11/2002 | Shioya et al. | 438/790 |
| 6,486,082 B1 | 11/2002 | Cho et al. | |
| 6,500,773 B1 | 12/2002 | Gaillard et al. | |
| 6,509,259 B1 | 1/2003 | Wang et al. | |
| 6,514,880 B2 | 2/2003 | Matsuki et al. | |
| 6,524,974 B1 | 2/2003 | Sukharev | |
| 6,541,367 B1 | 4/2003 | Mandal | |
| 6,541,398 B2 | 4/2003 | Grill et al. | 438/780 |
| 6,548,899 B2 | 4/2003 | Ross | |
| 6,562,690 B1 | 5/2003 | Cheung et al. | |
| 6,582,777 B1 | 6/2003 | Ross et al. | |
| 6,583,048 B1 | 6/2003 | Vincent et al. | 438/623 |
| 6,583,071 B1 | 6/2003 | Weidman et al. | |
| 6,596,627 B2 | 7/2003 | Mandal | |
| 6,605,549 B2 | 8/2003 | Leu et al. | |
| 6,642,157 B2 | 11/2003 | Shioya et al. | 438/789 |
| 6,649,540 B2 * | 11/2003 | Wang et al. | 438/789 |
| 6,652,922 B1 | 11/2003 | Forester et al. | |
| 6,656,837 B2 * | 12/2003 | Xu et al. | 438/676 |
| 6,734,533 B2 | 5/2004 | Wong | |
| 6,737,365 B1 | 5/2004 | Kloster et al. | |
| 2001/0004479 A1 | 6/2001 | Cheung et al. | |
| 2001/0005546 A1 | 6/2001 | Cheung et al. | |
| 2001/0017761 A1 | 8/2001 | Ditzik | |
| 2001/0021590 A1 | 9/2001 | Matsuki | |
| 2001/0055672 A1 | 12/2001 | Todd | |
| 2002/0037442 A1 | 3/2002 | Grill et al. | |
| 2002/0068458 A1 | 6/2002 | Chiang et al. | |
| 2002/0098714 A1 | 7/2002 | Grill et al. | 438/778 |
| 2002/0142579 A1 | 10/2002 | Vincent et al. | 438/623 |
| 2002/0142858 A1 | 10/2002 | Mandal | |
| 2002/0160626 A1 | 10/2002 | Matsuki et al. | |
| 2002/0180051 A1 | 12/2002 | Grill et al. | |
| 2002/0197849 A1 | 12/2002 | Mandal | |
| 2003/0008998 A1 | 1/2003 | Aoi | |
| 2003/0017718 A1 | 1/2003 | Aoi | |
| 2003/0104689 A1 | 6/2003 | Shioya et al. | |
| 2003/0104708 A1 | 6/2003 | Cho et al. | |
| 2003/0109136 A1 | 6/2003 | Shioya et al. | |
| 2003/0111712 A1 | 6/2003 | Andideh | |
| 2003/0116421 A1 | 6/2003 | Xu et al. | |
| 2003/0176030 A1 | 9/2003 | Tsuji et al. | |
| 2003/0186000 A1 | 10/2003 | Li et al. | |
| 2003/0194495 A1 | 10/2003 | Li et al. | 427/255.28 |
| 2003/0194880 A1 | 10/2003 | Singh et al. | 438/778 |
| 2003/0198742 A1 | 10/2003 | Vrtis et al. | 427/255.28 |
| 2003/0211728 A1 | 11/2003 | Mandal | |
| 2003/0224593 A1 | 12/2003 | Wong | |
| 2003/0232495 A1 | 12/2003 | Moghadam et al. | |
| 2004/0038514 A1 | 2/2004 | Hyodo et al. | |
| 2004/0039219 A1 | 2/2004 | Chen et al. | |
| 2004/0048960 A1 | 3/2004 | Peterson et al. | |
| 2004/0076764 A1 | 4/2004 | Forester et al. | |
| 2004/0093593 A1 | 5/2004 | Lukas et al. | |
| 2004/0096672 A1 | 5/2004 | Lukas et al. | |
| 2004/0101632 A1 | 5/2004 | Zhu et al. | |

FOREIGN PATENT DOCUMENTS

| | | |
|---|---|---|
| EP | 0 771 886 A1 | 5/1997 |
| EP | 0 774 533 A1 | 5/1997 |
| EP | 0 840 365 A2 | 5/1998 |
| EP | 0 849 789 A2 | 6/1998 |
| EP | 0 885 983 A1 | 12/1998 |
| EP | 0 926 715 A2 | 6/1999 |
| EP | 0 926 724 A2 | 6/1999 |
| EP | 0 935 283 A2 | 8/1999 |
| EP | 1 037 275 A1 | 9/2000 |
| EP | 1 123 991 A2 | 8/2001 |
| EP | 1 354 980 A1 | 10/2003 |
| GB | 2 316 535 A | 2/1998 |
| JP | 9-008031 | 1/1997 |
| JP | 9-64029 | 3/1997 |
| JP | 9-237785 | 9/1997 |
| JP | 9-251997 | 9/1997 |
| JP | 9-260369 | 10/1997 |
| JP | 10-242143 | 9/1998 |
| JP | 11-251293 A | 9/1999 |
| WO | WO 98/08249 A1 | 2/1998 |
| WO | WO 98/59089 A1 | 12/1998 |
| WO | WO 99/21706 A1 | 5/1999 |
| WO | WO 99/38202 A1 | 7/1999 |
| WO | WO 99/41423 A1 | 8/1999 |
| WO | WO 99/55526 A1 | 11/1999 |
| WO | WO 00/01012 A1 | 4/2000 |
| WO | WO 01/01472 A1 | 1/2001 |
| WO | WO 01/61737 A1 | 8/2001 |
| WO | WO 02/43119 A2 | 5/2002 |

OTHER PUBLICATIONS

K. J. Taylor, et al., "Parylene Copolymers", Spring MRS, Symposium N, (1997) pp. 1–9.

A. Grill, et al., "Novel Low k Dielectrics Based on Diamondlike Carbon Materials", J. Electrochem Soc. vol. 145 No. 5, May 1998, pp. 1649–1653.

M. J. Loboda, et al., "Deposition of Low k Dielectric Films Using Trimethysilane", Electrochemical Soc. Proceedings, vol. 98–6, pp. 152.

S. McClatchie, et al., "Low Dielectric Constant Oxide Films Deposited Using CVD Techniques," Feb. 16–17, 1998, DUMIC Conf., pp. 311–318.

M. J. Loboda, et al., "Using Trimethylsilane To Improve Safety, Throughput and Versatility in PECVD Processes," Electrochemical Proceedings vol. 97–10, pp. 443–453.

M. J. Loboda, et al., "Safe Precursor Gas For Broad Replacement of $Sih_4$ In Plasma Processes Employed In Integrated Circuit Production," Materials Research Soc. vol. 447, pp. 145–151.

Y.S. Lin, et al., "Plasma Polymerization of Trimethylsilane in Cascade Arc Discharge," J. Applied Polymer Science, vol. 66, (1997), pp. 1653–1665.

A. Haas Bar–Ilan, et al., "A Comparative Study of Sub–Micron Gap Filling and Planarization Techniques," SPIE vol. 2636, pp. 277–288.

A. M. Wrobel, et al., "Reactivity of Alkylsilanes and Alkylcarbosilanes in Atomic Hydrogen–Induced Chemical Vapor Deposition," J. Electrochem. Soc., vol. 145, No. 3, Mar. 1998, pp. 1060–1065.

A. Grill, et al., "Diamondlike Carbon Materials as BEOL Interconnect Dielectrics: Integration Issues," Electrochemical Soc. Proceedings vol. 98–3, pp. 118–129.

Grill, et al. "Diamondlike Carbon Materials as Low–k Dielectrics" Conference Proceedings ULSI XII Materials Research Society, 1997, p. 417–422.

European Search Report for EP 00 11 2300, Dated Aug. 24, 2001. (AMAT/6147.P1).

Peters, "Pursuing the Perfect Low–K Dielectric," Semiconductor International Sep. 1998, (7) Pages.

Zhao, et al., "Integration of Low Dielectric Constant Materials in Advanced Aluminum and Copper Interconnects," Mat. Res. Soc. Symp. Proc. vol. 564, 1999, p. 485–497.

Robles, et al., "Characterization of High Density Plasma Chemical Vapor Deposited $\alpha$–Carbon and $\alpha$–Fluorinated Carbon Films for Ultra Low Dielectric Applications," DUMIC Conference, Feb. 1997, p. 26–33.

Sugahara, et al. "Low Dielectric Constant Carbon Containing $SiO2$ Films Deposited by PECVD Technique Using a Novel CVD Precursor," DUMIC Conference, Feb. 1997, p 19–25.

* cited by examiner

METHOD FOR DEPOSITING A LOW DIELECTRIC CONSTANT FILM

BACKGROUND OF THE INVENTION

1. Field of the Invention

Embodiments of the present invention relate to the fabrication of integrated circuits. More particularly, embodiments of the present invention relate to a process for depositing dielectric layers on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, such as un-doped silicon glass (USG) or fluorine-doped silicon glass (FSG), silicon dioxide, and polytetrafluoroethylene (PTFE), which are all commercially available.

While dielectric materials having dielectric constants of less than 4 have been developed, dielectric materials having lower dielectric constants, such as less than about 2.5 are desired. There is a need, therefore, for a controllable process for making lower dielectric constant materials to improve the speed and efficiency of devices on integrated circuits.

SUMMARY OF THE INVENTION

Embodiments of the invention include a method for depositing a low dielectric constant film including reacting a gas mixture comprising one or more organosilicon compounds and one or more silicon-free hydrocarbon-based compounds in the presence of RF power to deposit a silicon oxycarbide layer, and to deposit, in the absence of RF power, a substantially silicon-free layer comprising carbon and hydrogen. An embodiment is a low dielectric constant film having alternating layers of the silicon oxycarbide layer and the substantially silicon-free layer. The organosilicon compounds and the silicon-free hydrocarbon-based compounds do not react substantially with each other in the absence of RF power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
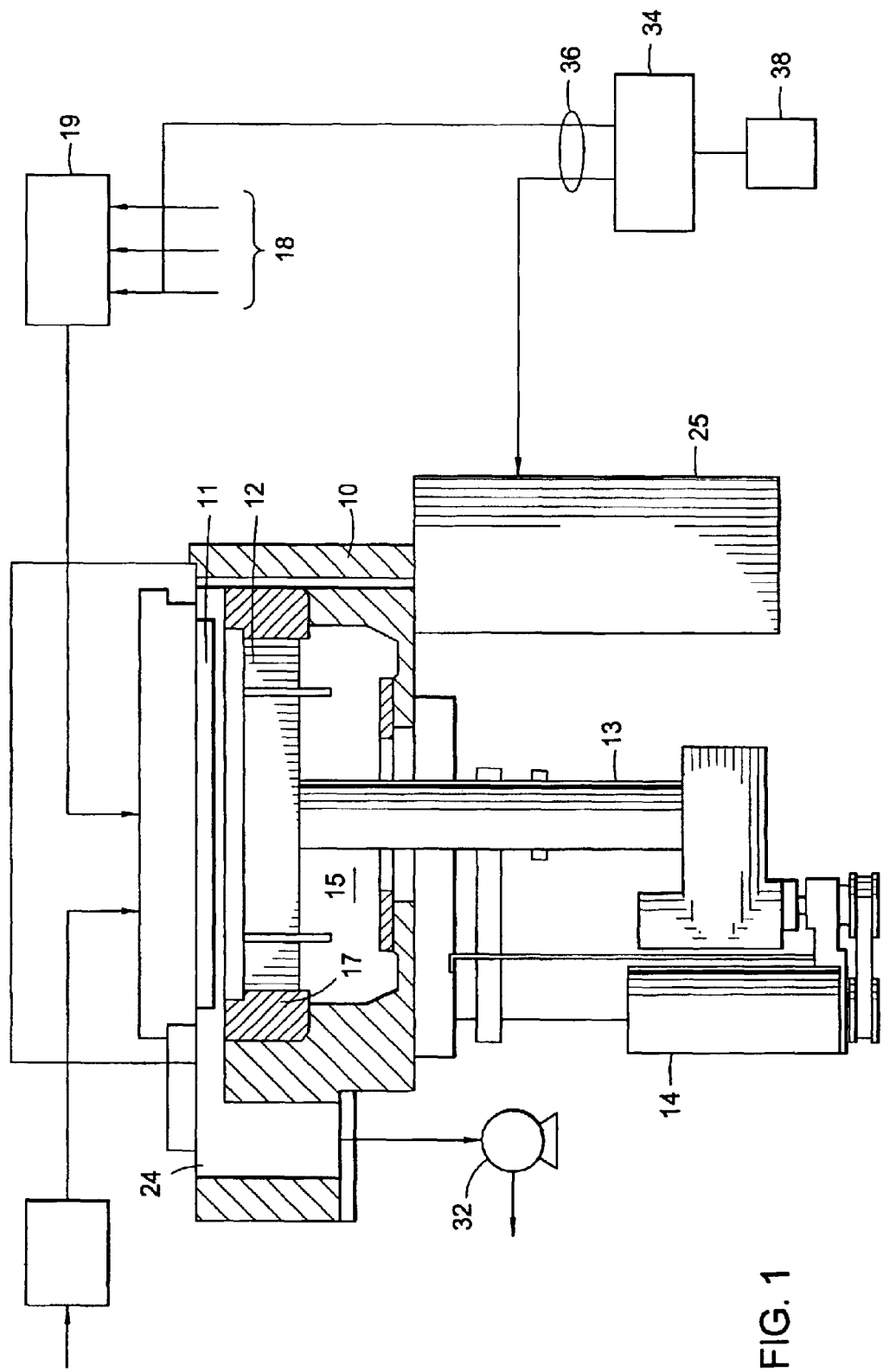
FIG. 1 is a cross-sectional diagram of an exemplary CVD reactor.

Embodiments of the invention provide low dielectric constant films that include one or more silicon oxycarbide layers having a dielectric constant less than 3 and one or more substantially silicon-free layers comprising carbon and hydrogen to provide films having an overall dielectric constant less than 2.5, and preferably having an overall dielectric constant of 2.0 to 2.2. In a preferred embodiment, the one or more silicon oxycarbide layers and the one or more substantially silicon-free layers comprising carbon and hydrogen are deposited from the same gas mixture. Using gas mixtures described below, a silicon oxycarbide layer is deposited in the presence of RF power, and a substantially silicon-free layer comprising carbon and hydrogen is deposited in the absence of RF power.

The silicon oxycarbide layers are deposited on a substrate, such as a semiconductor substrate, from a gas mixture comprising one or more organosilicon compounds and one or more silicon-free hydrocarbon-based compounds. The organosilicon compounds can include an organosilane or an oxygen-containing organosilicon compound. In embodiments in which the organosilicon compound is an organosilane, the gas mixture further comprises an oxidizing gas, such as oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof. In one embodiment, the gas mixture may include both an organosilane and oxygen-containing organosilicon compound, and optionally, an oxidizing gas.

The organosilane may be a commercially available organosilane that does not contain oxygen between silicon atoms. Examples of organosilanes that may be used include the following compounds:

| | |
|---|---|
| methylsilane | $CH_3$—$SiH_3$, |
| dimethylsilane | $(CH_3)_2$—$SiH_2$, |
| trimethylsilane | $(CH_3)_3$—$SiH$, |
| ethylsilane | $CH_3$—$CH_2$—$SiH_3$, |
| disilanomethane | $SiH_3$—$CH_2$—$SiH_3$, |
| bis(methylsilano)methane | $CH_3$—$SiH_2$—$CH_2$—$SiH_2$—$CH_3$, |
| 1,2-disilanoethane | $SiH_3$—$CH_2$—$CH_2$—$SiH_3$, |
| 1,2-bis(methylsilano)ethane | $CH_3$—$SiH_2$—$CH_2$—$CH_2$—$SiH_2$—$CH_3$, |
| 2,2-disilanopropane | $SiH_3$—$C(CH_3)_2$—$SiH_3$, |
| diethylsilane | $(C_2H_5)_2$—$SiH_2$, |
| propylsilane | $C_3H_7$—$SiH_3$, |
| vinylmethylsilane | $(CH_2{=}CH)CH_3SiH_2$, |
| 1,1,2,2-tetramethyldisilane | $HSi(CH_3)_2$—$Si(CH_3)_2H$, |
| hexamethyldisilane | $(CH_3)_3Si$—$Si(CH_3)_3$, |
| 1,1,2,2,3,3-hexamethyltrisilane | $H(CH_3)_2Si$—$Si(CH_3)_2$—$SiH(CH_3)_2$, |
| 1,1,2,3,3-pentamethyltrisilane | $H(CH_3)_2Si$—$SiH(CH_3)$—$SiH(CH_3)_2$, |
| dimethyldisilanoethane | $CH_3$—$SiH_2$—$(CH_2)_2$—$SiH_2$—$CH_3$, |
| dimethyldisilanopropane | $CH_3$—$SiH$—$(CH_2)_3$—$SiH$—$CH_3$, |
| tetramethyldisilanoethane | $(CH_3)_2$—$SiH$—$(CH_2)_2$—$SiH$—$(CH_3)_2$, |
| tetramethyldisilanopropane | $(CH_3)_2$—$Si$—$(CH_2)_3$—$Si$—$(CH_3)_2$, |
| 1,3,5-trisilano-2,4,6-trimethylene | —$(SiH_2CH_2)_3$— (cyclic). |

The oxygen-containing organosilicon compound may be a commercially available organosiloxane that contains oxygen between two or more silicon atoms. Examples of oxygen-containing organosilicon compounds that may be used include the following compounds:

| | |
|---|---|
| dimethyldimethoxysilane | $(CH_3)_2-Si-(OCH_3)_2$, |
| 1,3-dimethyldisiloxane | $CH_3-SiH_2-O-SiH_2-CH_3$, |
| 1,1,3,3-tetramethyldisiloxane (TMDSO) | $(CH_3)_2-SiH-O-SiH-(CH_3)_2$, |
| hexamethyldisiloxane (HMDS) | $(CH_3)_3-Si-O-Si-(CH_3)_3$, |
| 1,3-bis(silanomethylene)disiloxane | $(SiH_3-CH_2-SiH_2)_2O$, |
| bis(1-methyldisiloxanyl)methane | $(CH_3-SiH_2-O-SiH_2)_2CH_2$, |
| 2,2-bis(1-methyldisiloxanyl)propane | $(CH_3-SiH_2-O-SiH_2)_2C(CH_3)_2$, |
| hexamethoxydisiloxane (HMDOS) | $(CH_3O)_3-Si-O-Si-(OCH_3)_3$, |
| 1,3,5,7-tetramethylcyclotetrasiloxane (TMCTS) | $-(SiHCH_3-O)_4-$ (cyclic), |
| octamethylcyclotetrasiloxane (OMCTS) | $-(Si(CH_3)_4-O)_4-$ (cyclic), |
| 1,3,5,7,9-pentamethylcyclopentasiloxane | $-(SiHCH_3-O)_5-$ (cyclic), |
| 1,3,5,7-tetrasilano-2,6-dioxy-4,8-dimethylene | $-(SiH_2-CH_2-SiH_2-O)_2-$ (cyclic), |
| hexamethylcyclotrisiloxane | $-(Si(CH_3)_2-O)_3-$ (cyclic), |
| decamethylcyclopentasiloxane | $-(Si(CH_3)_2-O)_5-$ (cyclic). |

The silicon-free hydrocarbon-based compound may be a linear compound having 10 or more carbon atoms. As used herein, a "hydrocarbon-based compound" is a hydrocarbon or a compound that is mostly carbon and hydrogen, but also includes other atoms, such as oxygen. For example, alcohols are hydrocarbon-based compounds. Preferably, the hydrocarbon-based compounds used in embodiments of the invention do not include fluorine. A preferred example of a silicon-free hydrocarbon-based compound is polyethylene glycol.

The silicon oxycarbide layers and the one or more substantially silicon-free layers comprising carbon and hydrogen of the low dielectric constant film may be deposited using any processing chamber capable of chemical vapor deposition (CVD). A suitable reactor for performing the processes described herein is a DxZ™ chemical vapor deposition chamber commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention. A CVD chamber that is part of a cluster tool may be used. For example, a twin CVD chamber that is part of a Producer® system, commercially available from Applied Materials, Inc., may also be used.

Preferably, the low dielectric constant films described herein are deposited by a plasma enhanced process in a processing chamber. FIG. 1 shows a vertical, cross-section view of a parallel plate CVD processing chamber 10 that may be used to perform a plasma enhanced process. The chamber 10 includes a high vacuum region 15 and a perforated gas distribution manifold 11 for dispersing process gases there-through to a substrate (not shown). The substrate rests on a substrate support plate or susceptor 12. The susceptor 12 is mounted on a support stem 13 that connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. An insulator 17 surrounds the susceptor 12 and the substrate when the susceptor 12 and the substrate are in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

In a plasma enhanced process, a controlled plasma is typically formed adjacent the substrate by RF energy applied to the gas distribution manifold 11 using the RF power supply 25. Alternatively, RF power can be provided to the susceptor 12.

A system controller 34 controls the motor 14, the gas mixing system 19, and the RF power supply 25 which are connected therewith by control lines 36. The system controller 34 controls the activities of the CVD chamber and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard which defines board, card cage, and connector dimensions and types. The VME standard also defines the bus structure having a 16-bit data bus and 24-bit address bus. The interface between a user and the system controller is via a CRT monitor (not shown) and a light pen (not shown).

Figure 2:
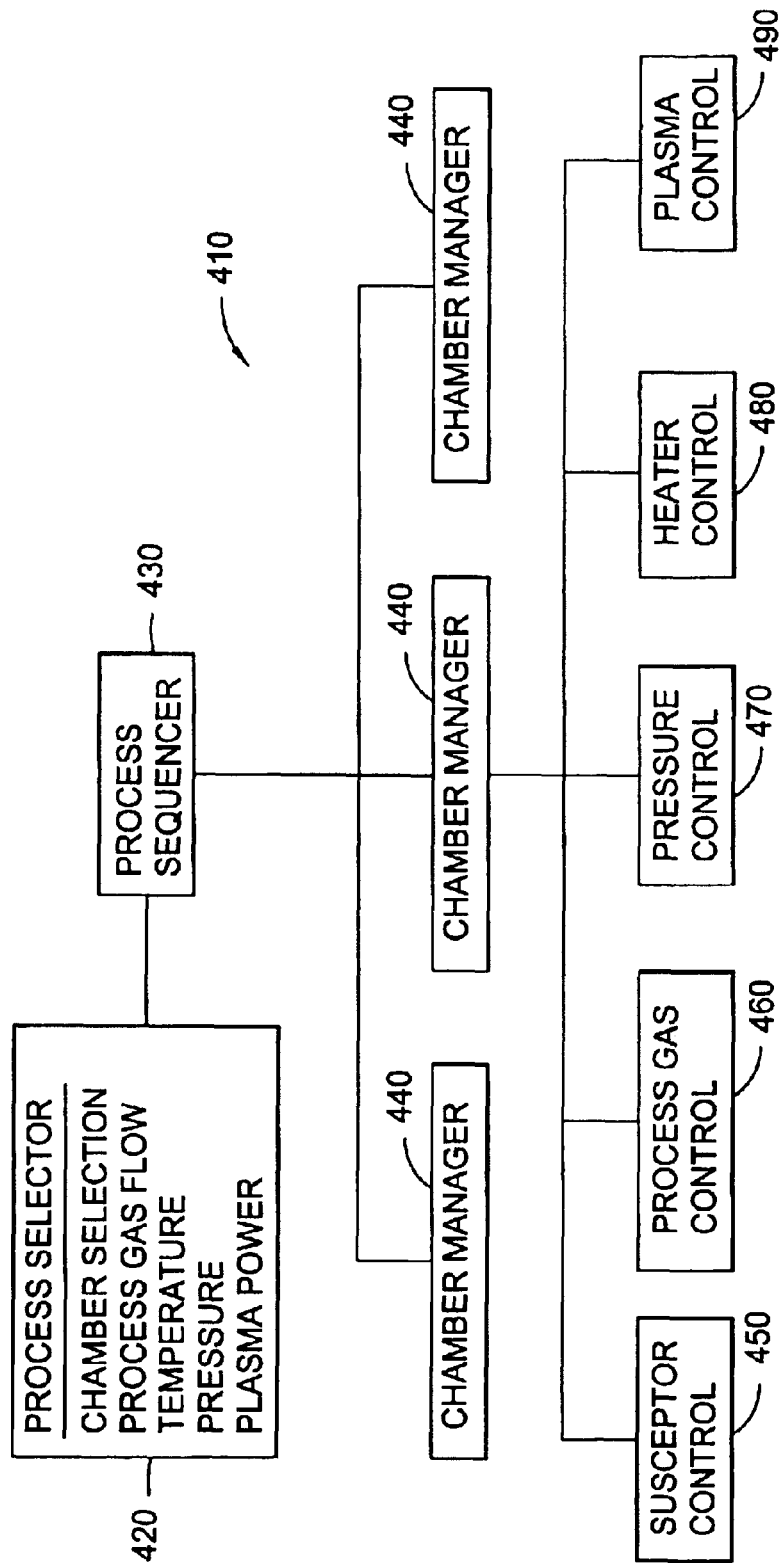
FIG. 2 is a flow chart of a process control computer program product used in conjunction with the exemplary CVD plasma reactor of FIG. 1.

FIG. 2 shows an illustrative block diagram of a hierarchical control structure of a computer program 410. The system controller 34 operates under the control of the computer program 410 stored on a hard disk drive 38. The computer program 410 dictates the timing, mixture of gases, RF power levels, susceptor position, and other parameters of a particular process. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

In one embodiment, a user enters a process set number and process chamber number into a process selector subroutine 420 in response to menus or screens displayed on the CRT monitor by using a light pen interface. The process sets are predetermined sets of process parameters necessary to carry out specified processes, and are identified by predefined set numbers. The process selector subroutine 420 (i) selects a desired process chamber on the cluster tool, and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of the system controller 34 and the signals for controlling the process are output to the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code for controlling chamber components that are used to load the substrate onto the susceptor 12, and optionally to lift the substrate to a desired height in the chamber 10 to control the spacing between the substrate and the gas distribution manifold 11. When a substrate is loaded into the chamber 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is flowed into the chamber 10 to stabilize the pressure in the chamber before reactive process gases are introduced into the chamber. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine; 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the chamber 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the chamber 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible.

While programmable processes have been described above with respect to the controller 34, the processes may be controlled by a central processing unit (CPU) that is one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines, when executed, transform the general purpose computer into a specific process computer that controls the chamber operation so that the deposition process described herein is performed. Alternatively, the chamber operation may be controlled using remotely located hardware, as an application specific integrated circuit or other type of hardware implementation, or a combination of software and hardware.

Referring again to FIG. 1, in the embodiments described herein, the RF power supply 25 can supply a single frequency RF power of about 13.56 MHz to about 60 MHz. Alternatively, the RF power may be delivered using mixed, simultaneous frequencies to enhance the decomposition of reactive species introduced into the high vacuum region 15. In one aspect, the RF power may be delivered at about 13.56 MHz, 60 MHz, or a combination thereof.

The RF power to the processing chamber is pulsed. The RF power may be pulsed on and off using a frequency of about 3 kHz to about 100 kHz The RF power level may be about 50 watts (W) to about 1000 W. The duty cycle of the pulsed RF power may be about 10% to about 90%.

In a preferred embodiment, a gas mixture comprising one or more organosilicon compounds and one or more silicon-free hydrocarbon-based compounds is introduced into the processing chamber, and a plasma is generated. In a preferred embodiment, the organosilicon compound is decamethylcyclopentasiloxane and the silicon-free hydrocarbon-based compound is polyethylene glycol. During a pulse of RF power, at least a portion of the one or more organosilicon compounds and the one or more silicon-free hydrocarbon-based compounds react, and a silicon oxycarbide layer containing material from both the one or more organosilicon compounds and the one or more silicon-free hydrocarbon-based compounds is deposited. The reaction of the one or more organosilicon compounds and the one or more silicon-free hydrocarbon-based compounds typically results in the degradation of some of the silicon-free hydrocarbon-based compounds. Pores may be created in the silicon oxycarbide layer as a result of the degradation of some of the silicon-free hydrocarbon-based compounds.

The flow of the gas mixture into the chamber may be continued during periods in which the RF power is not applied, i.e., "RF-off pulses." The components of the gas mixture may be flowed into the chamber at the same rates at which the components were flowed into the chamber during the pulse of RF power, or at different rates. Preferably, the chamber is maintained at a temperature whereby the one or more organosilicon compounds and the one or more silicon-free hydrocarbon-based compounds do not substantially react with each other in the processing chamber when the RF power is not applied. A carbon- and hydrogen-containing layer is deposited from the one or more silicon-free hydrocarbon-based compounds during the periods in which the RF power is not applied. The carbon- and hydrogen-containing layer may contain other atoms, depending on the silicon-free hydrocarbon-based compounds used in the gas mixture. For example, if the silicon-free hydrocarbon-based compounds include oxygen, the carbon- and hydrogen-containing layer may also contain oxygen. Preferably, the carbon- and hydrogen-containing layer does not include silicon, or is substantially silicon-free. Typically, the substantially silicon-free layer comprising carbon and hydrogen is not porous.

Either the silicon oxycarbide layer or the substantially silicon-free layer comprising carbon and hydrogen may be deposited on a substrate first, depending on whether the first layer is deposited on the substrate in the presence or absence of RF power. The silicon oxycarbide layers and the substantially silicon-free layers comprising carbon and hydrogen are deposited to form a film of a desired thickness. Generally, a low dielectric constant film formed from the silicon oxycarbide layers and the substantially silicon-free layers comprising carbon and hydrogen is a bi-phase film having one phase that is not porous, i.e., the substantially silicon-free layers comprising carbon and hydrogen, and one phase that is porous, i.e., the silicon oxycarbide layers.

During the deposition of the layers, the chamber may have a temperature of about 0° C. to a temperature insufficient to cause significant thermal chemical vapor deposition of the organosilicon compounds. Preferably, the chamber has a temperature of about 0° C. to about 400° C., such as about 0° C. to about 50° C. The one or more organosilicon compounds may be introduced into the chamber at a rate of about 100 mgm to about 1500 mgm. The one or more silicon-free hydrocarbon-based compounds may be introduced into the chamber at a rate of about 100 mgm to about 1500 mgm. A carrier gas, such as helium, may be introduced into the chamber at a rate of about 500 sccm to about 2000 sccm. Optionally, an oxidizing gas may be flowed into the chamber at a rate of about 0 sccm to about 200 sccm. The pressure of the chamber may be about 1 torr to about 100 torr.

Optionally, the low dielectric constant films described herein may be annealed after they are deposited. For example, the films may be subjected to a temperature between about 100° C. and about 400° C. for about 10 minutes to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power is about 200 W to about 1,000 W at a frequency of about 13.56 MHz, and the preferable substrate spacing is between about 300 mils and about 800 mils.

The annealing treatment may remove unstable organic components from the silicon oxycarbide layers of the low dielectric constant films, creating voids or pores within the silicon oxycarbide layers. However, it is believed that the processing conditions used to deposit the silicon oxycarbide layers are typically sufficient to remove a sufficient amount of organic material from the silicon oxycarbide layers to achieve a low dielectric constant film having a desired porosity and a desired low dielectric constant without an additional annealing step.

Dielectric films deposited according to the embodiments described herein have dielectric constants of less than 2.5. It is believed that the embodiments described herein provide a well-controlled, i.e., consistent, process for depositing low dielectric constant films, as the film properties can be tailored by adjusting the processing conditions for depositing the silicon oxycarbide layers and the substantially silicon-free layers comprising carbon and hydrogen. For example, the porosity of the films may be controlled by varying the amount of the silicon-free hydrocarbon-based compound flowed into the chamber and/or by varying the length of the RF off period during which the substantially silicon-free layer comprising carbon and hydrogen is deposited. Generally, it is believed that increasing the flow of the silicon-free hydrocarbon-based compound during the pulses of RF power will increase the porosity of the deposited silicon oxycarbide layer, while increasing the flow of the silicon-free hydrocarbon-based compound during the RF off period or lengthening the RF off period will increase the relative amount of the typically non-porous substantially silicon-free layer comprising carbon and hydrogen in the deposited film, thus decreasing the overall porosity of the deposited film.

The following example illustrates a low dielectric constant film of the present invention. The film is deposited using a chemical vapor deposition chamber that is part of an integrated processing platform. In particular, the film is deposited using a DxZ™ chemical vapor deposition chamber, available from Applied Materials, Inc. of Santa Clara, Calif.

HYPOTHETICAL EXAMPLE 1

A low dielectric constant film is deposited on a substrate from the following reactive gases at a chamber pressure of about 10 Torr and a temperature of about 200° C.:

Decamethylcyclopentasiloxane, at about 800 mgm;

Polyethylene glycol, at about 800 mgm;

Oxygen, at about 100 sccm; and

Helium, at about 1200 sccm.

A power level of about 500 W at a frequency of 13.56 MHz is applied to the showerhead for plasma enhanced deposition of the film. The RF power is pulsed, and has a duty cycle of about 20%. Silicon oxycarbide layers are deposited when the RF power is on, and substantially silicon-free layers comprising carbon and hydrogen are deposited when the RF power is off. The alternating silicon oxycarbide layers and substantially silicon-free layers comprising carbon and hydrogen form a low dielectric constant film.

While the foregoing is directed to embodiments of the present invention, other and further embodiments of the invention may be devised without departing from the basic scope thereof, and the scope thereof is determined by the claims that follow.

What is claimed is:

1. A method for depositing a film having a dielectric constant less than 2.5, comprising:

depositing a silicon oxycarbide layer from a gas mixture comprising one or more organosilicon compounds and one or more silicon-free hydrocarbon-based compounds in the presence of RF power; and depositing a substantially silicon-free layer comprising carbon and hydrogen from the gas mixture in the absence of RF power.

2. The method of claim 1, wherein the one or more organosilicon compounds comprise an organosilane, and the gas mixture further comprises an oxidizing gas.

3. The method of claim 2, wherein the organosilane is selected from the group consisting of methylsilane, dimethylsilane, trimethylsilane, ethylsilane, disilanomethane, bis(methylsilano)methane, 1,2-disilanoethane, 1,2-bis(methylsilano)ethane, 2,2-disilanopropane, diethylsilane, propylsilane, vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, tetramethyldisilanopropane, 1,3,5-trisilano-2,4,6-trimethylene, and combinations thereof.

4. The method of claim 1, wherein the one or more organosilicon compounds comprise an oxygen-containing organosilicon compound.

5. The method of claim 4, wherein the oxygen-containing organosilicon compound is selected from the group consisting of dimethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, hexamethoxydisiloxane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylene, hexamethylcyclotrisiloxane, decamethylcyclopentasiloxane, and combinations thereof.

6. The method of claim 1, wherein the one or more silicon-free hydrocarbon-based compounds comprise a linear compound having 10 or more carbons.

7. The method of claim 1, wherein the one or more organosilicon compounds is decamethylcyclopentasiloxane, and the one or more silicon-free hydrocarbon-based compounds is polyethylene glycol.

8. The method of claim 1, wherein the RF power is about 50 W to about 1000 W.

9. The method of claim 1, wherein the RF power has a duty cycle from about 10% to about 90%.

10. The method of claim 1, wherein the frequency of the RF power is about 13.56 MHz to about 60 MHz.

11. The method of claim 1, wherein the reacting and the depositing steps are repeated to form a film of a desired thickness.

12. A method for depositing a film having a dielectric constant less than 2.5, comprising:

depositing a porous silicon oxycarbide layer in the presence of RF power from a gas mixture comprising one or more organosilicon compounds and one or more silicon-free hydrocarbon-based compounds; and depositing a substantially silicon-free layer comprising carbon and hydrogen in the absence of RF power from the gas mixture under conditions such that the one or more organosilicon compounds and the one or more silicon-free hydrocarbon-based compounds do not react substantially with each other, wherein the silicon oxycarbide layer and the substantially silicon-free layer comprising carbon and hydrogen form a film having a dielectric constant less than 2.5.

13. The method of claim 12, wherein the one or more organosilicon compounds comprise an organosilane, and the gas mixture further comprises an oxidizing gas.

14. The method of claim 13, wherein the organosilane is selected from the group consisting of methylsilane, dimethylsilane, trimethylsilane, ethylsilane, disilanomethane, bis(methylsilano) methane, 1,2-disilanoethane, 1,2-bis(methylsilano)ethane, 2,2-disilanopropane, diethylsilane, propylsilane, vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, tetramethyldisilanopropane, 1,3,5-trisilano-2,4,6-trimethylene, and combinations thereof.

15. The method of claim 12, wherein the one or more organosilicon compounds comprise an oxygen-containing organosilicon compound.

16. The method of claim 15, wherein the oxygen-containing organosilicon compound is selected from the group consisting of dimethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, hexamethoxydisiloxane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylenehexamethylcyclotrisiloxane decamethylcyclopentasiloxane, and combinations thereof.

17. The method of claim 12, wherein the one or more silicon-free hydrocarbon-based compounds comprise a linear compound having 10 or more carbons.

18. The method of claim 12, wherein the one or more organosilicon compounds is decamethylcyclopentasiloxane and the one or more silicon-free hydrocarbon-based compounds is polyethylene glycol.

* * * * *

UNITED STATES PATENT AND TRADEMARK OFFICE
CERTIFICATE OF CORRECTION

PATENT NO. : 6,897,163 B2  Page 1 of 1
APPLICATION NO. : 10/355379
DATED : May 24, 2005
INVENTOR(S) : Frederic Gaillard and Srinivas D. Nemani It is certified that error appears in the above-identified patent and that said Letters Patent is hereby corrected as shown below:

In the Claims

Column 12, Claim 14, Line 19: Change "bis(methylsilano) methane" to --bis(methylsilano)methane--

Column 12, Claim 16, Lines 39-41: Change "1,3,5,7-tetrasilano-2,6-dioxy-4,8-dimethylenehexamethylcyclotrisiloxane" to --1,3,5,7-tetrasilano-2,6-dioxy-4,8-dimethylene, hexamethylcyclotrisiloxane--

Column 12, Claim 16, Line 41: Insert a comma after "hexamethylcyclotrisiloxane"

Signed and Sealed this

Eighth Day of August, 2006

JON W. DUDAS
*Director of the United States Patent and Trademark Office*